United States Patent
Kawashima et al.

[11] Patent Number: 5,118,957
[45] Date of Patent: Jun. 2, 1992

[54] METHOD AND APPARATUS FOR PRECISELY DETECTING SURFACE POSITION OF A PATTERNED WAFER

[75] Inventors: Haruna Kawashima, Kawasaki; Akiyoshi Suzuki, Tokyo, both of Japan

[73] Assignee: Canon Kabushiki Kaisha, Tokyo, Japan

[21] Appl. No.: 728,318

[22] Filed: Jul. 8, 1991

Related U.S. Application Data

[63] Continuation of Ser. No. 419,774, Oct. 11, 1989, abandoned.

Foreign Application Priority Data

Oct. 11, 1988 [JP] Japan .................. 63-256314

[51] Int. Cl.⁵ .................................. G01N 21/86
[52] U.S. Cl. .......................... 250/561; 356/394
[58] Field of Search ............ 250/548, 557, 561; 356/400, 407, 376, 394, 392

[56] References Cited

U.S. PATENT DOCUMENTS

| | | | |
|---|---|---|---|
| 4,362,389 | 12/1982 | Koizumi et al. | 356/401 |
| 4,395,117 | 7/1983 | Suzuki | 355/43 |
| 4,600,282 | 7/1986 | Yamamura et al. | 353/122 |
| 4,714,331 | 12/1987 | Oda et al. | 353/122 |
| 4,823,014 | 4/1989 | Miyawaki | 250/561 |
| 4,874,954 | 10/1989 | Takahashi et al. | 250/548 |
| 4,952,970 | 8/1990 | Suzuki et al. | 355/43 |

*Primary Examiner*—David C. Nelms
*Assistant Examiner*—Que T. Le
*Attorney, Agent, or Firm*—Fitzpatrick, Cella, Harper & Scinto

[57] ABSTRACT

A surface position detecting method, including the steps of: detecting a surface shape of a first wafer having a pattern formed thereon or a surface shape of a second wafer having a pattern which is substantially of the same structure as that of the pattern of the first wafer; detecting, on the basis of detection of the surface shape, an error which might be caused at the time of detection of a surface position of the first wafer in dependence upon the structure of the pattern thereof; and detecting the surface position of the first wafer while correcting the detected error.

55 Claims, 8 Drawing Sheets

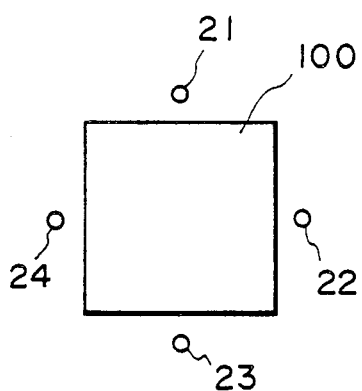
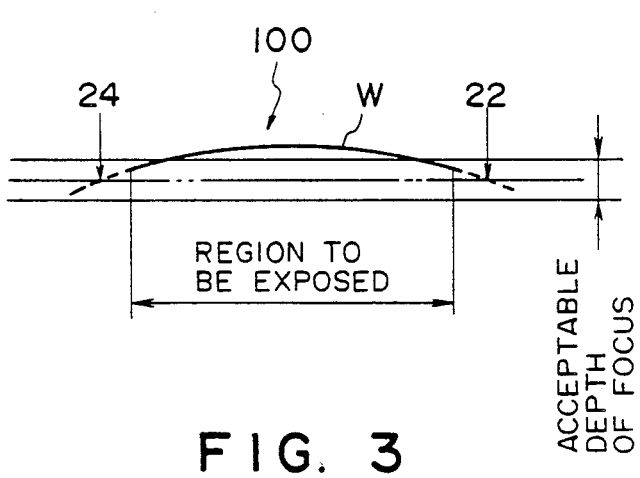
FIG. 2  FIG. 3
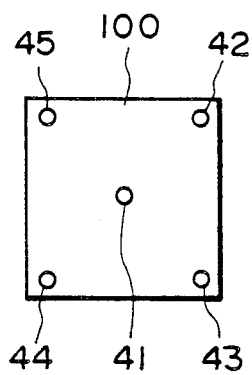
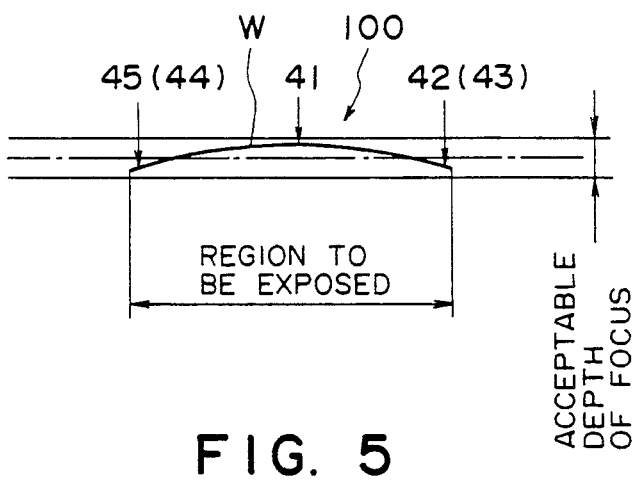
FIG. 4  FIG. 5

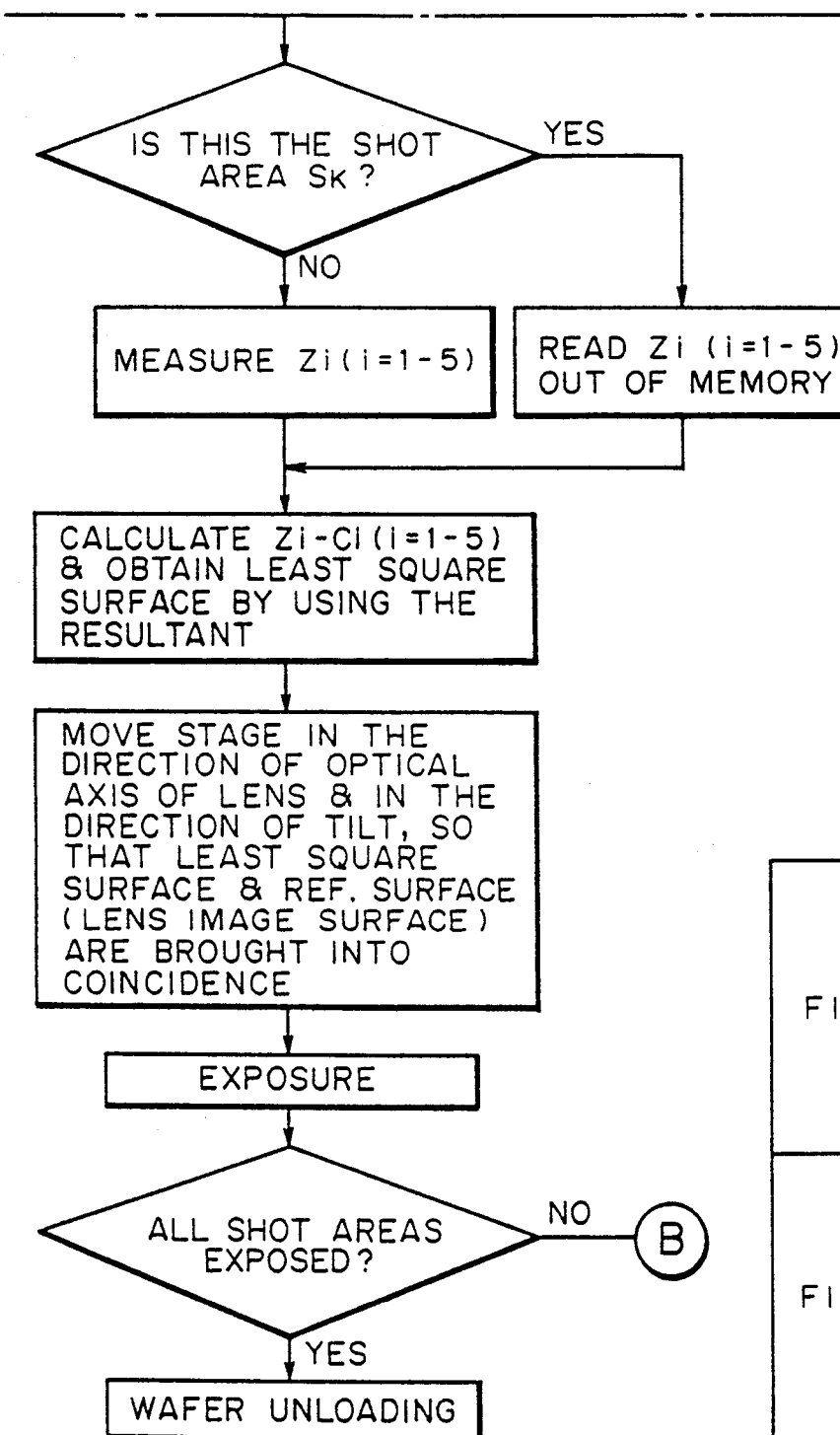
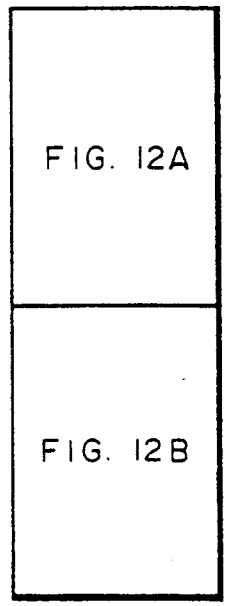
FIG. 12B
FIG. 12

METHOD AND APPARATUS FOR PRECISELY DETECTING SURFACE POSITION OF A PATTERNED WAFER

This application is a continuation of application Ser. No. 07/419,774 filed Oct. 11, 1989, now abandoned.

FIELD OF THE INVENTION AND RELATED ART

This invention relates to a surface position detecting method and apparatus and, more particularly, to a surface position detecting method and apparatus suitably usable in a reduction projection exposure apparatus (called a "stepper"), for detecting the position or inclination of a surface of a wafer, relative to an image of a reticle formed through a projection optical system of the exposure apparatus, with respect to the direction of an optical axis of the projection optical system.

Currently, in accordance with an increasing degree of integration of a very large scaled integrated circuit (VLSI), circuit patterns are being miniaturized to a greater extent than ever. Along with such a trend, the numerical aperture (NA) of a reduction projection lens system of a stepper is being made larger and larger, with the result of a narrower acceptable depth (depth of focus) of such lens system in the circuit pattern transfer process. Also, there is a trend to an exposure region (angle of view) defined by the reduction projection lens system.

In this environment, in order to allow superior transfer of a circuit pattern over the entire enlarged exposure region, it is necessary to position, with certainty, each exposure area (shot area) of a wafer as a whole within the acceptable depth of a reduction projection lens system.

To achieve this, it is important to detect with high precision the position and inclination of the surface of a wafer with respect to an image surface of the reduction projection lens system (i.e. an image of a reticle) and to adjust the position and inclination of the wafer surface.

A conventional example of detecting the position or inclination of the surface of a wafer in a stepper, there is a method in which the surface position of a wafer at plural points on the wafer surface is detected by using an air-microsensor means and, on the basis of the result of detection, the position and inclination of the wafer surface is determined, as disclosed in U.S. Pat. Nos. 4,714,331 and 4,600,282;. In another conventional method light is projected on the surface of a wafer with inclination and, by using a detection optical system adapted to detect any positional deviation of a reflection point, on the wafer surface, of reflection light from the wafer surface as a positional deviation of the reflection light upon a sensor, the position of the wafer surface is detected.

With these conventional surface position detecting methods, however, it is difficult to enhance the detection accuracy and, therefore, it is not possible to satisfy the above-described requirements, required in a stepper in which the numerical aperture and the view angle of a reduction projection lens system are being enlarged.

Further, both of the method which uses an air-microsensor means and the method which uses a detection optical system, involve respective inconveniences such as follows.

With the multiplepoint measurement using the air-microsensor means, as shown in FIG. 2 it is possible to define measuring points 21–24 only outside an exposure area (region to be exposed) 100 on a wafer and, therefore, it is not possible to obtain information on the wafer surface position, at a central part of the exposure area 100. As a consequence, for such a wafer W as having in an exposure area 100 a surface shape like that shown in FIG. 3, only with respect to the positions corresponding to the measuring points 22 and 24 which are outside the exposure area 100, the wafer W can be aligned with a best imaging surface of a reticle pattern by the reduction projection lens system, as depicted by a chain line with dots in FIG. 3. This leads to a possibility that the central part of the exposure area 100 goes out of the acceptable depth of focus of the reduction projection lens system and thus results in a failure of superior transfer of the reticle pattern to the exposure area.

With the optical detecting method using a detection optical system, there is no limitation to defining measuring points in an exposure area on a wafer, and as shown in FIG. 4 it is possible to define a measuring point 41 at a central part of an exposure area 100 and, therefore, it is possible to obtain positional information of the central part of the wafer surface. As a consequence, even for such a wafer W as having in an exposure area 100 a surface shape like that shown in FIG. 5, at the position of an average of the measuring points within the exposure area 100, the wafer W can be aligned with a best imaging surface of a reticle pattern by the reduction projection lens system, as illustrated by a chain line with a dot in FIG. 5. As a result, the whole surface of the exposure area 100 can be placed within the acceptable depth of focus of the reduction projection lens system, leading to a possibility of superior transfer of the reticle pattern to the exposure area. However, with such method that uses a detection optical system, there arises a problem of the effect of interference which occurs between the light reflected by the surface of a resist applied to a wafer and the light reflected by the surface of a substrate of the wafer.

At the measuring points 41–45 in the exposure area 100, the wafer substrate may have different structures which are different from each other in accordance with an IC pattern formed on the wafer W. More specifically, as an example, the wafer substrate may have various reflection factors which are determined in dependence upon whether or not the substrate has a part coated with aluminum (Al). With a change in intensity of the reflection light from the wafer substrate, the degree of interference changes. Accordingly, there is a possibility that for different measuring points different detection errors are produced as a result of the interference. Since the position of the wafer surface as detected by multiplepoint detection of such optical method can not be free from the effect of interference as described above, if the error due to the effect of interference is large as compared with the quantity of the acceptable depth of focus of the reduction projection lens system, it is not possible to position the wafer surface exactly at the best imaging surface position of the reticle pattern, thus resulting in failure of superior transfer of the reticle pattern.

SUMMARY OF THE INVENTION

It is accordingly an object of the present invention to provide a surface position detecting method and apparatus by which the surface position of a wafer can be detected with high precision.

In accordance with an aspect of the present invention, to achieve this object, there is provided a surface position detecting method, comprising the steps of: detecting a surface shape of a first wafer having a pattern formed thereon or a surface shape of a second wafer having a pattern which is substantially of the same structure as that of the pattern of the first wafer; detecting, on the basis of detection of the surface shape, an error which might be caused at the time of detection of a surface position of the first wafer in dependence upon the structure of the pattern thereof; and detecting the surface position of the first wafer while correcting the detected error.

In accordance with another aspect of the present invention, there is provided a surface position detecting apparatus, comprising: measuring means for directing a radiation beam to at least one of first and second wafers having patterns of substantially the same structure, and for receiving any of the radiation beam reflected from the first and/or second wafer, the measuring means producing a signal corresponding to the surface position of each of or one of the first and second wafers; and detecting means for detecting the surface position of each of or one of the first and second wafers, on the basis of the signal from said measuring means; wherein the detecting means includes displacing means for displacing each of or one of the first and second wafers relatively to the radiation beam so that the radiation beam is directed to each of different parts of the displaced wafer, and error detecting means cooperable with said displacing means to detect the surface shape of each of or one of the first and second wafers, on the basis of plural signals corresponding to the surface positions of plural parts of each of or one of the first and second wafers, to thereby detect an error which might be caused in the detection of the surface position of the first wafer in dependence upon the structure of the pattern thereof; and wherein the surface position detecting means detecting the surface position of the first wafer by using a signal in which the detected error is corrected.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 2 is an enlarged view schematically showing the positional relationship between an exposure area and measuring points, in the surface position detection using an air-microsensor means.

FIG. 3 is a representation, illustrating the positional relationship between an acceptable depth of focus and a wafer surface, in the surface position detection using the air-microsensor means.

FIG. 4 is an enlarged view schematically showing the positional relationship between an exposure area and measuring points, in the surface position detection using a detection optical system.

FIG. 5 is a representation, illustrating the positional relationship between an acceptable depth of focus and a wafer surface, in the surface position detection using the detection optical system.

FIG. 12A and 12B are a flow chart showing another example of surface position adjusting operation which uses a surface position detecting method of the present invention.

DESCRIPTION OF THE PREFERRED EMBODIMENTS

Figure 1:
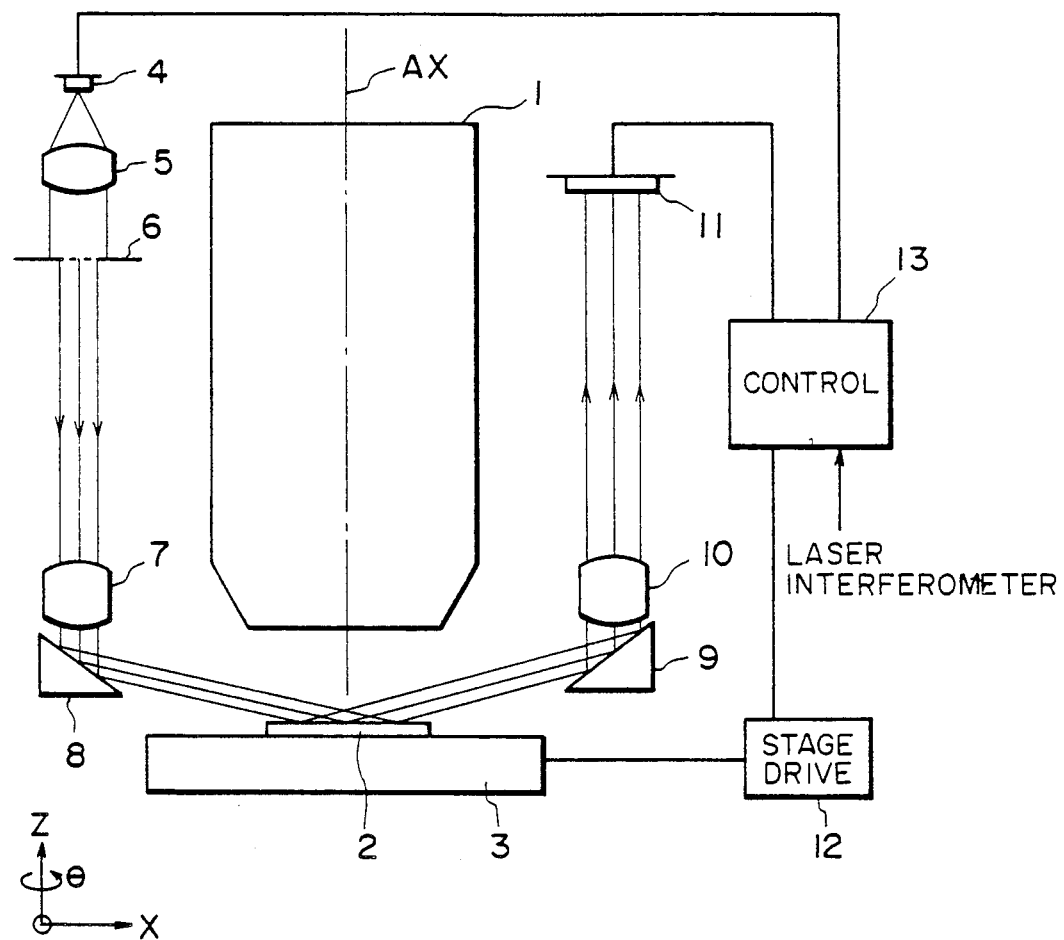
FIG. 1 is a fragmentary schematic view of a reduction projection exposure apparatus which uses a surface position detecting method according to the present invention.

FIG. 1 is a fragmentary schematic view of a reduction projection exposure apparatus which uses a surface position detecting method of the present invention.

In FIG. 1, denoted at 1 is a reduction projection lens system having an optical axis which is denoted at AX in FIG. 1. The projection lens system 1 is adapted to project, in a reduced scale of predetermined magnification (1/5–1/20, for example), a circuit pattern formed on a reticle (not shown) disposed above the projection lens system to form an image of the reticle pattern on the image surface thereof. The optical axis AX is in parallel to a Z-axis direction as illustrated in the drawing. Denoted at 2 is a wafer having a surface coated with a resist. On this wafer 2, there are a number of arrayed exposure areas (shot areas) having been formed in the preceding exposure process or processes. Denoted at 3 is a stage for carrying thereon the wafer 2, and the wafer 2 is held fixed on the wafer stage 3 by attraction. The wafer stage 3 comprises an X-stage which is movable in an X-axis direction, a Y-stage which is movable in a Y-axis direction, and a Z-stage which is movable in the Z-axis direction and also which is rotationally movable about axes parallel to the X-axis, Y-axis and Z-axis directions. The axes of X, Y, and Z are so set that they intersect with each other perpendicularly. Accordingly, by moving the wafer stage 3, the position of the surface of the wafer 2 can be adjusted in the direction of the optical axis AX of the reduction projection lens system 1 as well as in a plane perpendicular to the optical axis AX, and any inclination of the wafer 2 surface relative to the image of the reticle pattern can be adjusted.

Reference numerals 4–11 in FIG. 1 denote elements of a detection optical system which is provided to detect the surface position and inclination of the wafer 2. Numeral 4 denotes a high-luminance light source such as a light emitting diode, a semiconductor laser or otherwise, for example, and numeral 5 denotes an illumination lens. Light emanating from the light source 4 is transformed by the illumination lens substantially into a parallel light which illuminates a masking member 6 having pinholes of a number of five, in this embodiment. The light beams passing through the pinholes of the masking member 6 go through an imaging lens 7 and impinge on a deflecting mirror 8 by which the advancing direction is deflected. After this, the light beams are projected on the wafer 2 surface with inclination. Here, the imaging lens 7 and the deflecting mirror 8 cooperate to form on the wafer 2 the images of the pinholes of the masking member 6. As illustrated in FIG. 4, the light beams irradiate five points (41-45), including a central part 41 of an exposure area 100 of the wafer 2, and they are reflected at the respective sites. Namely, in the present embodiment, the masking member 6 is formed with five pinholes and, at the five measuring points in the exposure area 100, including the central part thereof, the surface position measurement is performed.

Each light reflected at a corresponding measuring point on the wafer 2 is deflected by another deflecting mirror 9 and, thereafter, it passes through a detection lens 10 and impinges on a two-dimensional position detecting device 11. Here, the detection lens 10 cooperates with the imaging lens 7, the deflecting mirror 8, the wafer 2 and the deflecting mirror 9, to form on the two-dimensional position detecting device 11 the images of the pinholes of the masking member 6. Thus, in this embodiment, the masking member 6, the wafer 2 and the two-dimensional position detecting device 11 are at such positions which are mutually optically conjugate with each other.

The two-dimensional position detecting device 11 comprises a CCD, for example, and is adapted to detect the positions of incidence of the plural light beams upon the light receiving surface of the device 11, independently of each other. Any change in the position of the wafer 2 in the direction of the optical axis AX of the projection lens system 1 can be detected as a deviation of the position of incidence of each light upon the two-dimensional position detecting device 11. Therefore, on the basis of an output signal from the two-dimensional position detecting device 11, the positions of the wafer surface in the optical axis AX direction, at the five measuring points 41-45 in the exposure area 100 on the wafer 2 can be detected. The output signal from the position detecting device 11 is supplied through a signal line to a control device 13.

Any displacement of the wafer stage 3 in the X-axis and the Y-axis directions is measured in a well-known manner by using a laser interferometer, not shown, and a signal representing the amount of displacement of the wafer stage 3 is supplied from the laser interferometer to the control device 13 through a signal line. Also, the movement of the wafer stage 3 is controlled by a stage driving device 12 which is adapted to receive an instruction signal supplied from the control device 13 through a signal line and, in response to this signal, the stage driving device 12 drives the wafer stage 3. The stage driving device 12 includes first and second driving means. The first driving means is adapted to adjust the position (x, y) and the rotation ($\theta$) of the wafer 2 in a plane perpendicular to the optical axis AX. The second driving means is adapted to adjust the position of the wafer 2 in the optical axis AX direction (Z-axis direction) as well as any tilt ($\theta_{x,y}$) of the wafer 2.

The control device 13 is operable to process the output signal (surface position data) from the position detecting device 11 in a manner to be described later, to detect the position of the wafer 2 surface. On the basis of the result of this detection, the control device 13 applies an appropriate instruction signal to the stage driving device 12. In response to this instruction signal, the second driving means of the stage driving device 12 operates to adjust the position of the wafer 2 in the optical axis AX direction as well as the tilt of the wafer.

Next, the manner of detecting the position of the exposure area of the wafer 2 in accordance with the surface position detecting method of the present invention, will be explained.

As described hereinbefore, the major factor of the detection error which might be caused at the time of detection of the surface position of the wafer 2 with use of the detection optical system (4-11) shown in FIG. 1, is the interference between the light reflected by the surface of the resist of the wafer 2 and the light reflected by the surface of the wafer 2 substrate. Also, since the wafer 2 substrate has different surface structures at different sites in each exposure area 100, detection errors which might be caused in the detection made to different sites in the exposure area 100 (e.g. the measuring points 41 - 45 in FIG. 4) may have individual values different from each other in dependence upon the difference in structure of the substrate surface at the respective sites (for example, the difference in reflection condition such as distributed reflection factors).

However, the reduction projection exposure apparatus such as shown in FIG. 1 is an apparatus adapted to transfer, in sequence, a pattern of a reticle onto different exposure areas on a wafer 2 in the step-and-repeat manner and, before the surface positioned detecting operation and the transfer (exposure) operation, the position of an IC pattern already formed on an exposure area on the wafer 2 is adjusted to be registered with the reticle pattern. Accordingly, if the operation of aligning each exposure area of the wafer 2 with the reticle pattern and the operation of surface position detection at plural sites in each exposure area are executed in sequence, while holding the position of the wafer 2 in the optical axis AX direction substantially fixed and also holding the detection optical system (4-11) fixed to maintain constant light projecting position, then the detection optical system (4-11) does detect the surface positions substantially at the same sites (measuring points) in each of the exposure areas arrayed on the wafer 2. This corresponds to that the detection optical system (4-11) detects the surface position at each site in each exposure area as having the same substrate structure. From this, it is predicted that the effect of interference between the reflection light from the wafer substrate and the reflection light from the resist surface, upon the result of detection, has an individual value for corresponding ones of the measuring points in different exposure areas. Actually, it has been confirmed by experiments that, for corresponding ones of the measuring points, substantially the same detection error occurs.

In the present embodiment, such phenomenon is applied to the surface position detection and, in the manner to be described later, the surface position data concerning each measuring point in the exposure area is corrected, whereby accurate surface position information is obtained.

Figure 7:
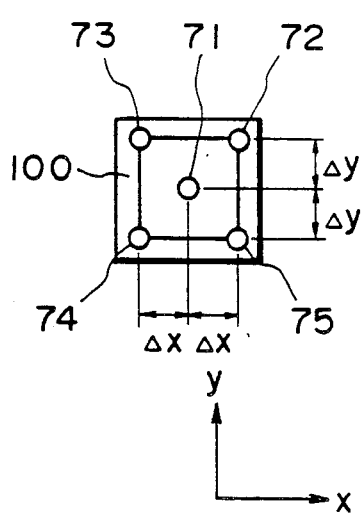
FIG. 7 is an enlarged view, illustrating the disposition of measuring points set in an exposure area.
Figure 8:
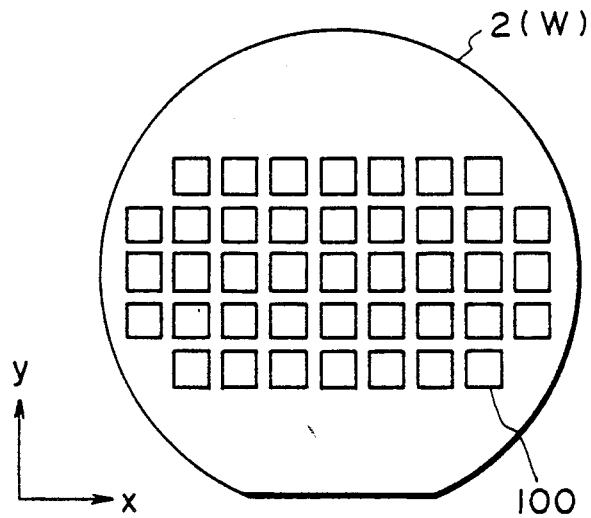
FIG. 8 is a plan view which exemplifies the layout of exposure areas (shot areas) defined on a wafer.

Initially, as shown in FIG. 7, five measuring points 71-75 are set for each exposure area 100. The measuring point 71 is substantially at the center of the exposure area 100, and it intersects with the optical axis AX at the time of the surface position detection. The remaining measuring points 72-75 are in a peripheral part of the exposure area 100. If the measuring point 71 is at a point (x, y) in an X-Y coordinate system, then the positions of the remaining measuring points 72-75 are at such points that can be represented by $(x+\Delta x, y+\Delta y)$, $(x-\Delta x, y+\Delta y)$, $(x-\Delta x, y-\Delta y)$ and $(x+\Delta x, y-\Delta y)$, respectively. As best seen in FIG. 8, all the exposure areas 100 are arrayed regularly on the wafer 2 along the X and Y axes.

Subsequently, the detection optical system (4-11) of FIG. 1 is set so that, when the position of a certain exposure area (shot area) 100 of the wafer 2 is adjusted to be aligned with the reticle pattern, the images of the pinholes of the masking member 6 are projected on the respective measuring points 71-75 of that exposure area 100. At this time, the exposure area 100 is positioned just underneath the reduction projection lens system 1 and, as described, the measuring point 71 intersects with the optical axis AX.

A plurality of exposure areas of the wafer 2, necessary for determination of surface shape function of the wafer 2, are selected in preparation. Then, by sequentially moving the wafer stage 3 stepwise, the thus preselected exposure areas of the wafer 2 are fed in sequence into the station just underneath the reduction projection lens system 1, and the alignment of each exposure region with the reticle pattern is performed. The movement of the wafer stage 3 in this operation is controlled by using output signals from the laser interferometer (not shown), under the influence of the control device 13 and the driving device 12. Then, by using the detection optical system (4-11), the positions Z1-Z5 of the wafer 2 surface in the optical axis AX direction, at the measuring 20 points 71-75 of each exposure area, are detected. Signals corresponding to the thus detected positions Z1-Z5 are applied from the two-dimensional position detecting device 11 to the control device 13.

Here, the surface positions Z1-Z5 at the measuring points 71-75 of each exposure area 100 of the wafer 2, each can be expressed in the form of a surface shape function such as follows:

$$\begin{aligned} Z1 &= F1(x, y) \\ &= f1(x, y) + C1 \\ Z2 &= F2(x + \Delta x, y + \Delta y) \\ &= f2(x + \Delta x, y + \Delta y) + C2 \\ Z3 &= F3(x - \Delta x, y + \Delta y) \\ &= f3(x - \Delta x, y + \Delta y) + C3 \\ Z4 &= F4(x - \Delta x, y - \Delta y) \\ &= f2(x - \Delta x, y - \Delta y) + C4 \\ Z5 &= F5(x + \Delta x, y - \Delta y) \\ &= f5(x + \Delta x, y - \Delta y) + C5 \end{aligned} \quad (1)$$

The coordinate of x and y of each function is determined in the manner as illustrated in FIGS. 7 and 8. Since the actual surface position detection is executed for each of particular exposure areas selected as the subject of detection, each of the surface positions Z1-Z5 takes discrete values with respect to x and y. Also, $\Delta x$ and $\Delta y$ denote the interspacing between different measuring points, having been described with reference to FIG. 7. From the values Z1-Z5 as having been obtained at the respective measuring points 71-75 of the plural exposure areas, for each set of the surface positions Z1-Z5 (i.e. for each set of measuring points), it is possible to predict the surface shape of the wafer 2. Reference characters F1-F5 in equation (1) represent the surface shape functions as obtained with respect to the measuring points 71-75, through polynomial approximation, the characters f1-f5 represent the functions of only x and y, including no constant term, and characters C1-C5 represent the constant terms.

It is to be noted that, although the measured values obtained at the respective measuring points 71-75 may be those having been affected by the reflection light from the substrate surface of the wafer 2, it is still the fact that the measuring points 71-75 serve to detect the surface position of a wafer having a substrate surface of the same (single) surface shape. From the point that one and the same wafer surface is being examined, the surface shape of the wafer 2 as predicted from the values of Z1, Z2, Z3, Z4 or Z5 of corresponding ones of the measuring points of the exposure areas, would be the same as that as predicted from the other values. Since, however, for each measurement to one exposure area, the surface position detection at the respective measuring points is affected by the substrate structure which is intrinsic to each measuring point, as described hereinbefore, there is a shift by a constant certain quantity. Therefore, where a true function that represents the surface shape of the wafer 2 is denoted by f(x, y), then between the function f(c, y) and the functions f1-f5 the following relations are established:

$$\begin{aligned} f(x, y) &= f1(x, y) + \Delta f1(x, y) \\ &= f2(x, y) + \Delta f2(x, y) \\ &= f3(x, y) + \Delta f3(x, y) \\ &= f4(x, y) + \Delta f4(x, y) \\ &= f5(x, y) + \Delta f5(x, y) \end{aligned} \quad (2)$$

wherein fi(x, y) (where i=1-5) is a function including no constant term, and $\Delta f1$-$\Delta f5$ are functions representing minute differences of respective coefficients due to random components. The functions $\Delta f$-$\Delta f5$ each corresponds to a term which might be caused from a detection error produced in the detection system during the detection at corresponding measuring point or caused by the effect of dust or otherwise on the wafer. The functions f1-f5 are those which are the same as the aforementioned functions f1(x, y) f5(x – f5 $\Delta x$, y – $\Delta y$), and they are those having been subjected to coordinate conversion. Since the functions f1-f5 are those which are determined on the basis of the actually measured values of Z1-Z5, as described hereinbefore, the errors $\Delta f1$-$\Delta f5$ such as above arise.

Since the expanding equation or the order of the curved surface of each of the surface shape functions F1-F5, in equation (1), is predetermined in the form of a certain polynomial, the measured values of Z1-Z5 are used as the surface position data and, on the basis of a least square method, the coefficients of the functions F1-F5 (i.e. the coefficients of the functions f1-f5) are calculated. This can be done by solving the following equation:

$$\iint [Fi(x, y) - Zi(x, y)]^2 dxdy = 0$$
$$(i = 1-5)$$

wherein Fi(x, y) is a surface shape function, and Zi(x, y) is a measured value at each measuring point.

With a larger number of measured values (surface position data), the difference between each coefficient of the functions f1-f5 in equation (2) and the coefficient of the true function f becomes smaller. Therefore, in accordance with the precision as required, the number of exposure areas to be selected as the subject of detection may be determined.

Figure 11:
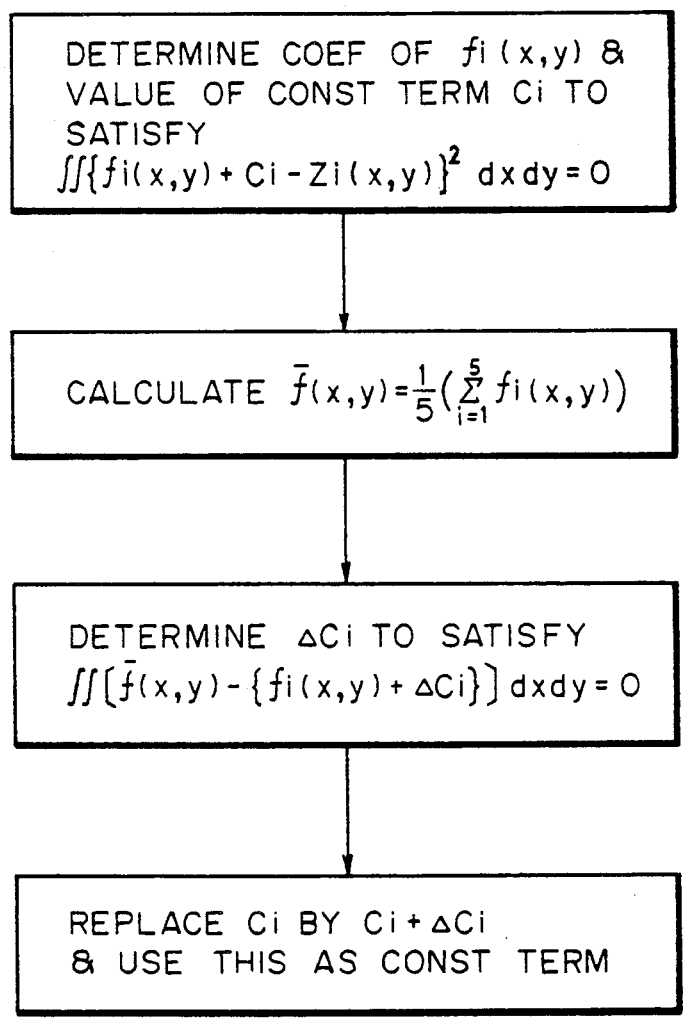
FIG. 11 is a flow chart showing an example of determination of a constant term of a surface shape function.

Further, as illustrated in the flow chart of FIG. 11, the averaging of the coefficients may be made:

$$\bar{f}(x, y) = 1/5 \left[ \sum_{i=1}^{5} fi(x, y) \right]$$

and $\Delta Ci$ (i=1-5) may be determined to satisfy the following relation:

$$\int\int \{\bar{f}(x, y) - [fi(x, y) + \Delta Ci]\}dxdy = 0$$
(i = 1-5)

and then, $$Ci' = Ci + \Delta Ci$$

may be calculated. By using obtained $Ci'$ as a constant term of each of the surface shape functions F1-F5, the reliability of each constant term can be enhanced.

Figure 6:
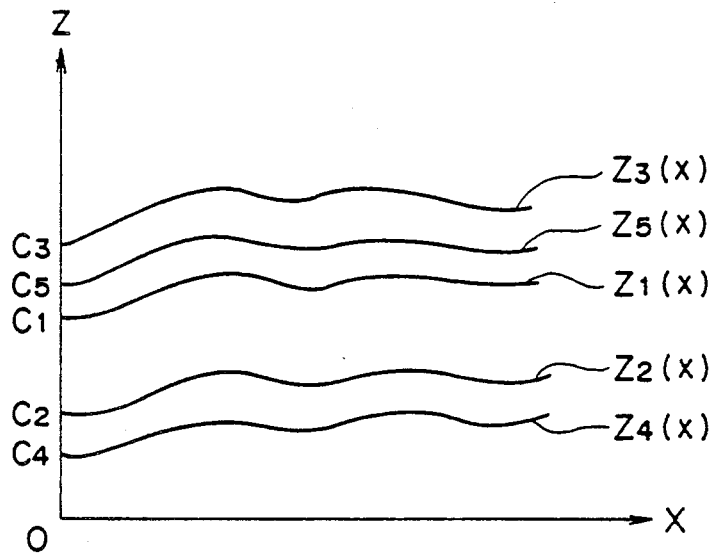
FIG. 6 is a graph which exemplifies surface shape functions.

In the present invention, the constant terms C1-C5 of the surface shape functions F1-F5 are treated as the intrinsic detection errors of the respective measuring points, to be caused at the time of detection. The values of these constant terms may be used as an offset or, alternatively, may be used to determine the offset. Examples of the surface shape functions F1-F5 are illustrated in FIG. 6. It is to be noted that in FIG. 6 the surface shape functions are depicted in the form of Z1(x)-Z5(x).

As an example, in the case where the quantity of the constant term of the surface shape function F1 is usable as an offset, the offset values at the time of position detection of the measuring points 71-75 in the exposure area 100 are directly set to the quantities of the constant terms C1-C5, and the surface position data as obtainable at the respective measuring points, at the time of detection, is corrected by using these offset values. In other words, from the measured values (surface position data) Zi of the respective measuring points 71-75, corresponding offset values Ci are subtracted, respectively, and the resultant quantities are used as the true surface position data. From this, the interrelationship in height of the respective measuring points (i.e. any tilt of the exposure area) can be detected exactly. On the basis of these true surface position data Zi-Ci (i=1-5) and by using a least square method, for example, a least square surface of the exposure area 100 is determined. When the position of the least square surface is denoted by Z and the true surface position data is denoted by Zi'(=Zi-Ci), then this determination can be made by obtaining, by calculation, such Z that satisfies the following relation:

$$\sum_{i=1}^{5} (Z - Zi')^2 \approx 0 \qquad (3)$$

From the result of the above, the degree of the inclination of the exposure area 100 as well as the position thereof in the optical axis AX direction can be determined. Particularly, the inclination of the exposure area 100 can be detected precisely.

Referring back to FIG. 1, the signal from the two-dimensional position detecting device 11 as inputted into the control device 13 is transformed into surface position data at the respective measuring points 71-75 of each exposure area which data is then memorized into a memory in the control device 13. When the surface position detection to all the exposure areas of the wafer 2, having been designated in preparation, is completed and surface position data of a predetermined number are memorized into the memory, the wafer 2 is unloaded from the wafer stage and, without executing the developing process or otherwise, the control device 13 determines the above-described surface shape functions by using the surface position data stored in the memory. Namely, for each set of surface position data corresponding to associated one of the measuring points 71-75, by using plural data a surface shape function Fi(x, y) (i=1-5) is determined. Then, the constant term Ci (i=1-5) of each function Fi(x, y) is determined. Then, on the basis of the thus determined constant terms Ci, respective offset values Coi (i=1-5) are determined and memorized into the memory.

Subsequently, the wafer stage 3 is moved to bring a first exposure area to a position just underneath the reduction projection lens system 1, and the position of the first exposure area is adjusted to be aligned with the reticle pattern. After this alignment, by using the detection optical system (4-11) the surface position detection is executed with respect to five measuring points (71-75) of the first exposure area. On the basis of the output signal from the two-dimensional position detecting device 11, the control device 13 prepares the surface position data of the respective measuring points. Then, the control device 13 reads the stored offset values Coi (i=1-5) out of the memory and corrects the respective surface position data concerning the first exposure area by using corresponding offset values, respectively, whereby five new (true) surface position data are provided. On the basis of the thus corrected five surface position data, the control device 13 detects a least square surface of the first exposure area 100 and calculates the spacing between the least square surface and the image of the reticle pattern in the optical axis AX direction as well as the magnitude and direction of inclination of the wafer 2 surface.

Then, the control device 13 supplies an instruction signal, corresponding to the result of calculation, to the stage driving device 12 to cause the same to adjust (correct) the position of the wafer 2 on the wafer stage, in the optical axis AX direction, as well as the inclination of the wafer. By this, the surface of the wafer 2, that is, the first exposure area thereof can be positioned in the best imaging surface of the projection lens system 1.

After completion of such surface position adjustment, exposure of the first exposure area is performed to execute the transfer of the reticle pattern.

After the exposure of the first exposure area is completed, the wafer stage 3 is driven to bring a second exposure area of the wafer 2 to a position just underneath the projection lens system 1 and, in the manner same as described above, the surface position detection and the surface position adjustment as well as the exposure operation are executed.

Figure 10:
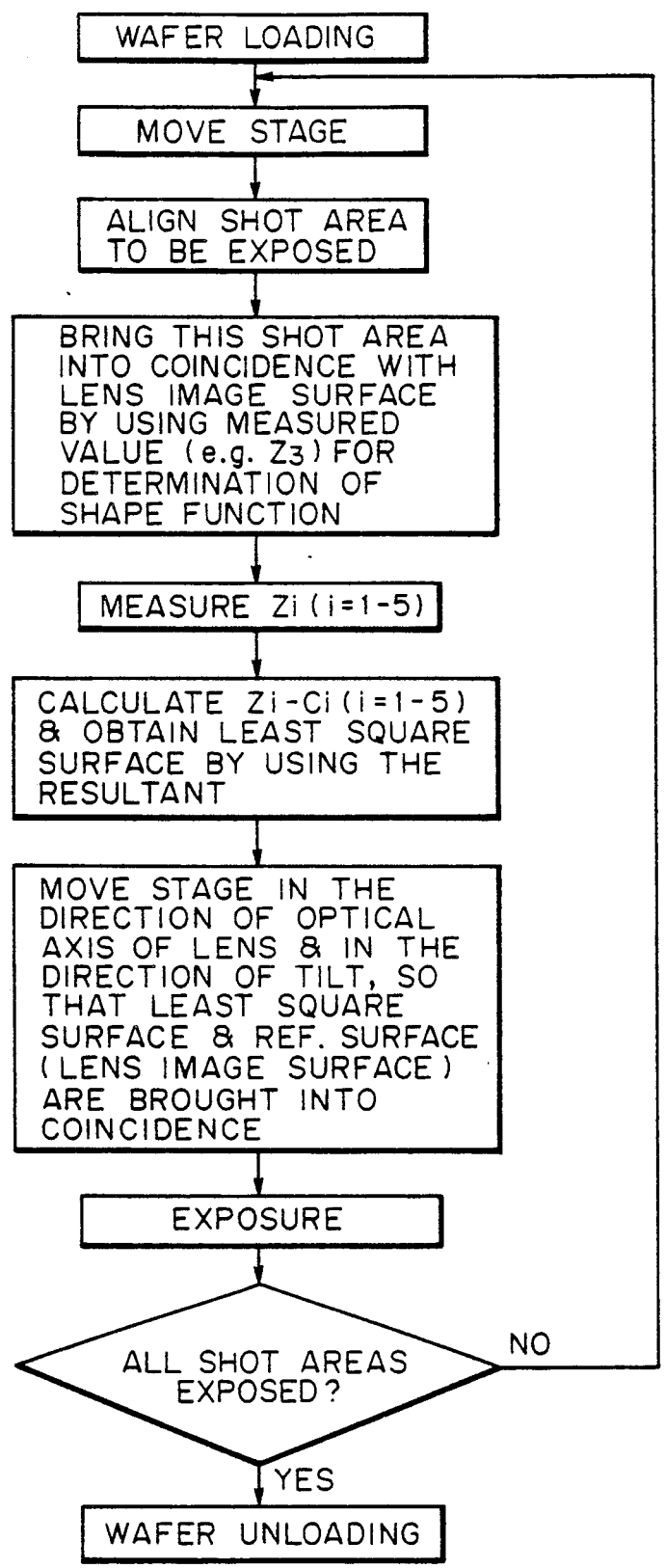
FIG. 10 is a flow chart showing an example of surface position adjusting operation which uses a surface position detecting method of the present invention.

The above-described procedure is briefly explained in the flow chart of FIG. 10.

In the present embodiment, of the plural measuring points, one that can be used as a reference for the surface position detection is determined in preparation (in this particular example, the measuring point 71 is used as a reference point), and the offset Co1 of that point is detected by experiments. The remaining offset values Co2-Co5 are obtained by subtracting, from the detected offset Co1, each of the differences between the constant term C1 and the remaining constant terms C2-C5. The determination of the offsets Co1-Co5 in the described manner effectively enhances the reliability of each offset. Accordingly, not only in regard to the detection of inclination of the wafer but also in regard to the detection of the surface position of the wafer 2 in the optical axis AX direction, the detection precision can be enhanced.

For experimental determination of the offset of the measuring point 71, one of plural wafers each having a circuit pattern printed thereon in the preceding process is used and, to such wafer, pattern printing is executed repeatedly to some exposure areas of this wafer while changing the position of the wafer with respect to the direction of the optical axis AX of the projection lens system. At this time, the surface position at the measuring point 71 of each exposure area is detected by using the detection optical system (4-11) and is memorized as the surface position data. Subsequently, the thus processed wafer is subjected to the developing process, and thereafter, the contrast of each pattern in the respective exposure areas of the wafer is observed so as to detect such one of the exposure areas that shows the maximum contrast. Then, any error (deviation) in the surface position data as collected at the time of pattern printing made to that one exposure area, with reference to a certain reference point (data) for the surface position detection through the detection optical system (4-11), is detected as an offset Co1. Since the reference point for the surface position detection is usually set as a point corresponding to the focus position of the pattern image, the position of the wafer during the experiments may be determined so that the measuring point 71 of each exposure area is positioned first at such focus position and then at some positions about the focus position.

These offset values are small, and in an apparatus that uses a conventional reduction projection lens system having a large depth of focus, they can be omitted. However, with a decrease in the depth of focus and resultant necessity of correction of the wafer surface inclination, even such small values can not be disregarded at present.

As an example, if the values of surface position at the respective measuring points are critical as compared with the acceptable depth of focus of a reduction projection lens system, it is possible that due to the effect of offset the wafer inclination is corrected in an inverse direction. Although usually the offset may be of an amount not greater than 0.5 micron, in the multiplepoint measurement to an exposure area there are produced random detection errors at the respective points. Additionally, if the wafer position should be corrected on the basis of the measure values, correcting the relationship of the measured values as in the present invention is very advantageous. This is because of the fact that practically it is very difficult to detect offsets at the measuring points in the peripheral part of an exposure area by executing focus chucking to these measuring points individually, although to do so only with respect to a single point at the center of the exposure area is not difficult.

The determination of detection errors at the respective measuring points on the wafer surface, described in the foregoing, has to be made to each of different processes in which different patterns are to be formed. However, with regard to the frequency, it is sufficient that such determination is made only once at an initial stage of each process. If the determination is made at an initial stage of each process and the resultant is stored into a memory of the control device, then it is possible to execute the manufacture of semiconductor chips with substantially no decrease in the throughput. Since the detection errors, i.e., the offset values Ci, are intrinsic to the measuring points, respectively, the number of exposure areas (shot areas) to be used for determination of the surface shape function Fi(x, y) is determined appropriately in accordance with the focusing precision as required in the apparatus. Namely, for a process in which not so high focusing precision is required, the number may be small. On the other hand, for a process in which strict precision is required, the number should be large. However, provided that the number of measurement shot areas is twenty (20), the time necessary for the stepwise movement between adjacent shot areas is 0.5 sec and the measuring time is 0.1 sec, then even in such case it requires only a period of about 12 sec for detection of the offset Ci. Further, as described hereinbefore, if the determination of the offset Ci is made only to first one of plural wafers in each lot and the thus obtained offset Ci is used for each one of the remaining wafers, then the decrease in the throughput can be disregarded without causing any inconveniences.

Figure 12A:
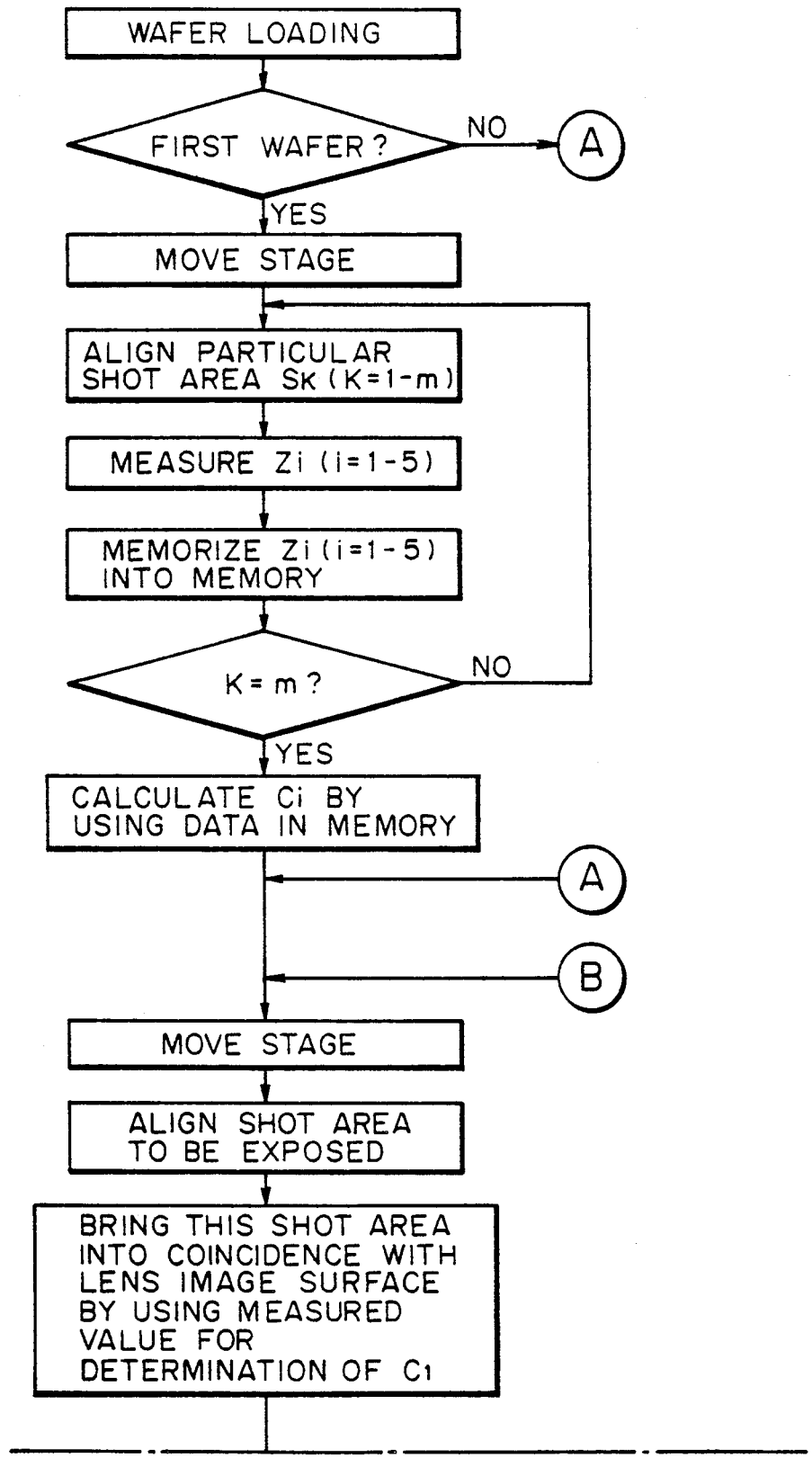

Although in the foregoing embodiment, after determination of the offset values C1-C5, with regard to all the measuring points of each exposure area of the wafer the measurement is made again to obtain the surface position data, in regard to those exposure areas having been used for determination of the offset values C1-C5 the surface position data as memorized into the memory at the time of the determination of the offset may be used directly. The procedure of surface position detection and surface position adjustment accompanied by exposure, to be made in the manner described above, is explained in the flow chart of FIG. 12.

In the embodiment described above, the determination of detection errors at the respective measuring points in each exposure area of the wafer should be made for each of the processes in which the patterns to be formed are different from each other. However, in order to ensure more accurate determination of the detection errors in each process, such a detection optical system as will be described below may be conveniently used.

Figure 9:
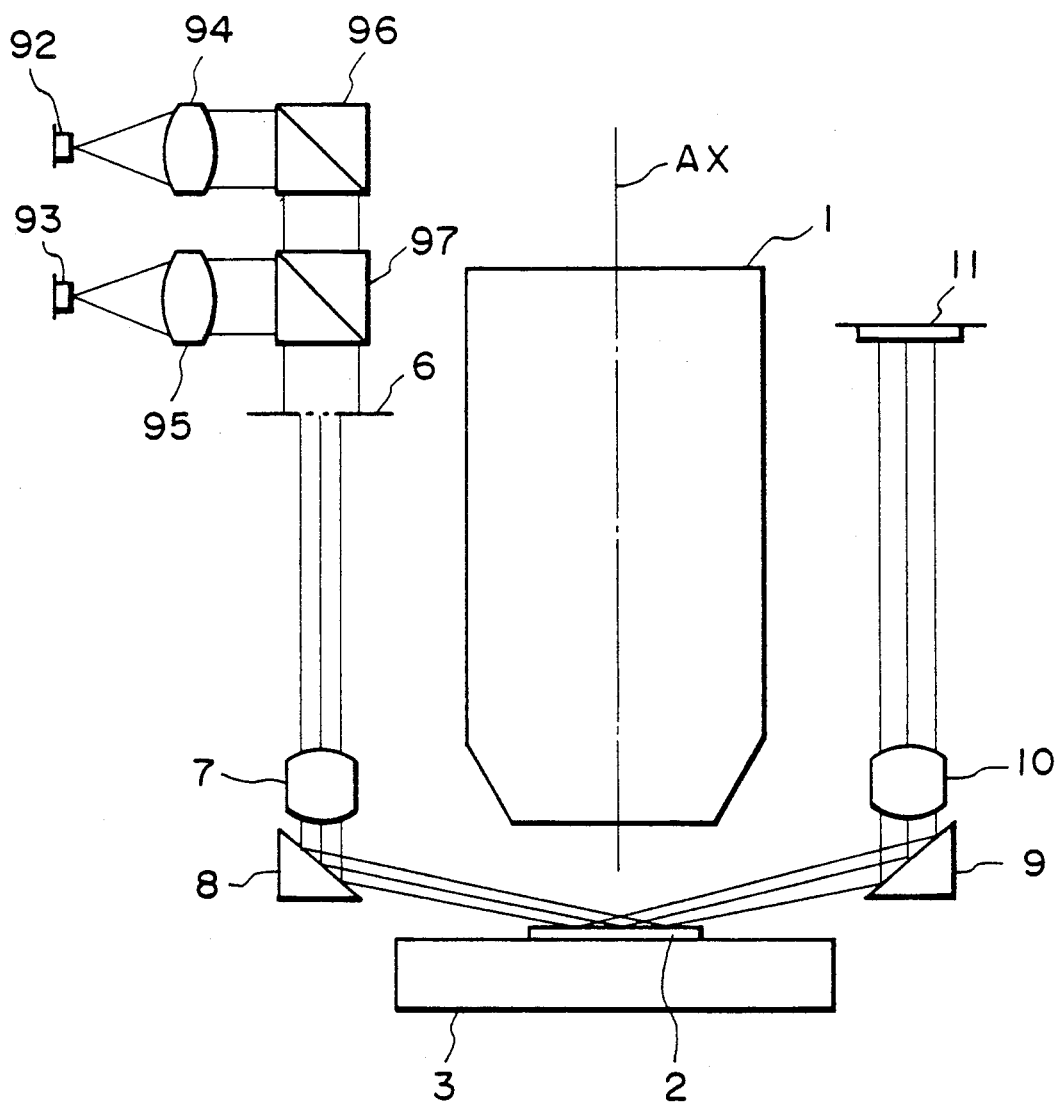
FIG. 9 is a fragmentary schematic view, showing another embodiment of a detection optical system.

FIG. 9 schematically shows the structure of such a detection optical system. This optical system differs from the optical system (4-11) shown in FIG. 1 in that the part provided to illuminate the masking member 6 having pinholes is constituted by a plurality of light sources which are adapted to emit lights of different wavelengths.

In FIG. 9, denoted at 92 and 93 are high-luminance light sources adapted to emit lights of different wavelengths and comprising light emitting diodes or semiconductor lasers, for example. The lights emanating from the light sources 92 and 93 pass through illumination lenses 94 and 95, respectively, and then are deflected by 90 degrees by means of a mirror 96 and a beam splitter (or a half mirror) 97, respectively. The light emanating from the light source 92 passes through the beam splitter 97 and, by this beam splitter 97, it is combined with the light from the light source 93 so that it goes along the same path of the light from the light source 93. Masking member 6 is illuminated uniformly with the two light beams emanating from the light sources 92 and 93, and by means of pinholes of the masking member 6 there are formed a plurality of light beams. These light beams are those in which lights of different wavelengths are combined and, after passing through an imaging lens 7 and being deflected by a deflecting mirror 8, they illuminate the measuring points on an exposure area of the wafer 2. As shown in FIG. 4, these light beams are reflected at five measuring points including the center of the exposure area, and the reflected light beams are deflected by another deflecting mirror 9 and, thereafter, they pass through a detection lens and impinge on a two-dimensional position detecting device 11. Here, images of the pinholes of the masking member 6 are formed on the light receiving surface of the detecting device 11.

Similarly to the FIG. 1 embodiment, any change in the position of the wafer 2 in the direction of the optical axis AX of the reduction projection lens system 1 can be detected as a deviation of the position of incidence of each light upon the position detecting device 11. As a result, the surface position at each of the five measuring points in the exposure area can be detected independently of the others.

Since, in the present embodiment, plural lights of different wavelengths are used as the detection light, even if the effect of interference between the reflection lights from the resist surface and from the wafer substrate changes due to any variation in resist film thickness between wafers in the same process, the averaging effect obtainable from the detection using different wavelength can reduce the variation in the detected value for these wafers.

In other words, by using lights of different wavelengths, it is possible to determine accurately the detection errors (offset values) concerning the respective measuring points, and therefore, it is possible to ensure superior reticle pattern transfer to all the wafers in the same process.

It is a further possible alternative that the direction of polarization of each light impinging on the wafer 2 is set so that it is S-polarized light with respect to the wafer 2 surface and, additionally, the angle of incidence of each light upon the wafer 2 surface is set not less than 80 degrees with respect to the optical axis AX. With this arrangement, the reflection light from the resist surface can be dominant and the intensity of reflection light from the wafer substrate can be made small. Therefore, the detection error of each measuring point can be determined more accurately.

In accordance with the present invention, a detection error of each measuring point in an exposure region of a wafer which error results from a portion of an IC pattern just below that measuring point and which is intrinsic to the structure of the pattern, can be detected as an offset and, by using the detected offset, the measurement data can be corrected. As a result, even if the acceptable depth of focus of a reduction projection lens system is made small with the increasing degree of integration of VLSI or even if the exposure area is made larger, the entire surface of the exposure region of the wafer can be positioned within the depth of focus, with certainty. As a result, the present invention provides an advantage that superior pattern transfer is ensured and circuits of higher degree of integration can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. A surface position detecting method, comprising the steps of:
   detecting a surface shape of a first wafer having a pattern formed thereon or a surface shape of a second wafer having a pattern which is substantially of the same structure as that of the pattern of the first wafer;
   detecting, on the basis of detection of the surface shape, an error arising at the time of detection of a surface position of the first wafer in dependence upon the structure of the pattern thereof; and
   detecting the surface position of the first wafer while correcting the detected error.

2. A method according to claim 1, wherein said step of detecting the surface shape comprises the steps of:
   detecting signals corresponding to the surface positions of plural portions of the first or second wafer in which portions substantially the same patterns are formed, wherein the signal detection is made with regard to those parts of said portions having similar or substantially the same pattern structure; and
   determining a parameter of a function representing the surface shape, in accordance with the detected signals.

3. A method according to claim 2, wherein the step of error detection comprises the steps detecting the error on the basis of a constant term of the function, obtainable from the determination of the parameter.

4. A method according to claim 3, wherein said step of detecting the surface position comprises:
   a first detecting step for detecting signals corresponding to the surface position of a part of the wafer having similar or substantially the same pattern structure as that of the part with respect to which the signal detection in the surface shape detection is made; and
   a second detecting step for correcting the an error of the signal detected at the first detecting step and for detecting the surface position of the wafer on the basis of an error-corrected signal.

5. A method according to claim 3, wherein said step of error detection comprises:
   a first detecting step for detecting signals corresponding to the surface positions of those parts of said portions of said first or second wafer, which parts are different from those having been examined with respect to the signal detection related to the surface shape detection and which parts have similar or substantially the same pattern structures;
   a second detecting step for detecting a constant term of a function representing the surface shape of the first or second wafer, on the basis of the signals detected at said first detecting step; and
   a third detecting step for measuring an error in the signal detection at the first detecting step, wherein on the basis of the constant term of the function obtained from the parameter determination, of the constant term obtained at the second detecting step and of the error detected at the third detecting step, the error in the surface position detection for the wafer is detected.

6. A method according to claim 5, wherein said step of surface position detection comprises:
   a fourth detecting step for detecting a first signal corresponding to the surface position of such part of the wafer that has a similar or substantially the same pattern structure as that of the part with respect to which the signal detection is made;

a fifth detecting step for detecting a second signal corresponding to the surface position of such part of the wafer that has a similar or substantially the same pattern structure as that of the part with respect to which the signal detection at the first detecting step is made; and a sixth detecting step for detecting the surface position of the first wafer, in accordance with a signal obtained through correction of the error on the basis of the first signal, and a signal obtained through correction of the error detected at said third detecting step on the basis of the second signal.

7. A method according to claim 6, wherein said sixth step comprises the step of determining the surface position of the first wafer by using at least square method.

8. A method according to claim 2, wherein said step of signal detection comprises the step of:

placing the first or second wafer on a stage which is movable in a direction perpendicular to an optical axis of a projection optical system;

moving the stage to bring, in sequence, each of the portions of the first or second wafer close to a site at which an image of a pattern of a reticle is to be projected by the projection optical system; and directing a radiation beam to such one of the portions positioned close to the site and receiving any of the radiation beam reflected at the part of the one portion to detect a signal corresponding to the surface position of said part, wherein the signal detection is made to each of the portions of the first or second wafer, whereby signals corresponding to the surface positions of the respective portions are detected.

9. A method according to claim 8, wherein the radiation beam comprises radiation of different wavelengths.

10. A method according to claim 8, wherein said step of surface position detection comprises the steps of:

directing a radiation beam to such part of a portion of the wafer that has a similar or substantially the same pattern structure as that of the part with respect to which the signal detection is made;

receiving any of the radiation beam reflected from the irradiated part of the wafer and for producing a signal corresponding to the surface position of the irradiated part; and correcting the error by using the produced signal and for detecting the surface position of the first wafer on the basis of an error-corrected signal.

11. A method according to claim 8, further comprising the step of, during movement of the stage, maintaining the position of the stage in the direction of the optical axis substantially constant.

12. A method according to claim 11, wherein said step of error detection comprises the step of detecting the error on the basis of a constant term of the function, obtainable from the determination of the parameter.

13. A surface position detecting apparatus, comprising:

measuring means for directing a radiation beam to at least one of the first and second wafers having patterns of substantially the same structure, and for receiving any of the radiation beam reflected from the first and/or second wafer, said measuring means producing a signal corresponding tot eh surface position of each of or one of the first and second wafers; and detecting means for detecting the surface position of each of or one of the first and second wafers, on the basis of the signal from said measuring means;

wherein said detecting means includes:

displacing means for displacing each of or one of the first and second wafers relative to the radiation beam so that the radiation beam is directed to each of different parts of the displaced wafer; and error detecting means cooperable with said displacing means to detect the surface shape of each of or one of the first and second wafers, on the basis of plural signals corresponding to the surface positions of plural parts of each of or one of the first and second wafers, to thereby detect an error in the detection of the surface position of the first wafer in dependence upon the structure of the pattern thereof; and wherein said surface position detecting means detects the surface position of the first wafer by using a signal in which the detected error is corrected.

14. An apparatus according to claim 13, wherein said error detecting means controls said displacing means so that the radiation beam is directed to each of predetermined parts of plural portions of the first or second wafer and so that signals corresponding to the surface positions of said predetermined arts are produced form said measuring means, and wherein said predetermined parts of said plural portions have similar or substantially the same pattern structures.

15. An apparatus according to claim 14, wherein said displacing means comprises a movable stage on which the first or second wafer can be placed, and driving means for moving said movable stage.

16. An apparatus according to claim 14, wherein said radiation beam comprises radiation of different wavelengths.

17. An apparatus according to claim 14, wherein said error detecting means determines a parameter of a function representing the surface shape, on the basis of signals corresponding to the surface positions of said predetermined parts of said portions, and detects the error on the basis of a constant term of the function.

18. An apparatus according to claim 17, wherein said measuring means directs a first and second radiation beams to the wafer so that the first radiation beam is projected to each of said predetermined parts while the second radiation beam is projected to those parts of said portions, different from said predetermined parts, wherein said different parts have similar or substantially the same pattern structures, wherein said error detecting means determines a parameter of a function representing the surface shape of the wafer, on the basis of signals representing the surface positions of said different parts produced from said measuring means, to thereby detect another constant of the function, and wherein the error is determined on the basis of a difference between the first-mentioned constant term and said other constant term.

19. An apparatus according to claim 18, wherein said error detecting means determines the error on the basis of differences between each constant term and the error caused at the surface position detection to said different parts in dependence upon the pattern structure.

20. A projection exposure method, comprising the steps of:

optically detecting the surface position, in a direction of an optical axis of a projection optical system, of each of different portions of a first wafer or a second wafer having substantially the same patterns;

determining a function representing the surface shape of the first or second wafer, on the basis of the optical detection, and for detecting, on the basis of a constant term of the function, any error in the optical detection of the surface position in the direction of the optical axis to be made at a predetermined portion of the wafer, in dependence upon the pattern structure thereof;

optically detecting the surface position of the predetermined portion of the wafer, and for correcting the error and determining the surface position of the predetermined portion;

substantially aligning the surface position of the predetermined portion with the position at which an image of a pattern of a reticle is focused, on the basis of the determination of the surface position; and projecting, after said aligning step, the image of the pattern of the reticle upon said predetermined portion of the wafer through the projection optical system.

21. A method according to claim 20, wherein said determining step, said aligning step and said projecting step are executed in sequence for each of the portions of the wafer.

22. A method according to claim 21, wherein said optically detecting step is made for each of those parts of the portions having similar or substantially the same pattern structures, and wherein the optical detection at the determining step is made to such part of the wafer that has a similar or substantially the same pattern structure as that of the part with respect to which said optical detection is made.

23. A method according to claim 22, wherein the optically detecting step is made to first and second parts of each of the portions of the wafer, and wherein the error detecting step determines a first function on the basis of the detection made to the first part of each portion and determines a second function on the basis of detection made to a second part of each portion, wherein the error is detected on the basis of constant terms of the first and second functions, and wherein the determining step is effective to optically detect the surface positions of plural parts of said predetermined portions, corresponding to the first and second parts, the surface position of the predetermined portion being determined on the basis of the detected surface positions.

24. A method according to claim 23, wherein the optical detection comprises a first detecting step for directing a first light beam to the first part or a part corresponding thereto and for detecting the surface position of the irradiated part on the basis of a positional deviation of the reflected beam from the irradiated part upon a photodetector, and a second detecting step for directing a second light beam to the second part or a part corresponding thereto and for detecting the surface position of the irradiated part on the basis of a positional deviation of the reflected beam from the irradiated part upon the photodetector.

25. A surface position detecting method, comprising the steps of:

detecting surface positions of first and second points in each of different portions of a first or second wafer having substantially the same patterns;

determining a first constant term of a function representing the surface shape of the first or second wafer, on the basis of the surface position detection with respect to each first point and determining a second constant term of a function representing the surface shape of the first or second wafer on the basis of the surface position detection made for each second point; and detecting the surface positions of first and second points in a predetermined portion of the wafer and for determining the surface position of the predetermined portion on the basis of the detection of the surface positions and of the detected first and second constant terms.

26. A method according to claim 25, further comprising the step of optically detecting the surface positions of the first and second points.

27. A method according to claim 26, wherein the first and second points in each portion are at positions corresponding to those of the first and second points in the other portions.

28. In a position determining method, usable with a substrate having different portions on which the same patterns are formed, for determining the surface position of each of the different portions by detecting the levels of first and second different sites in that portion by the use of an optical sensor, the improvements residing in the steps of:

determining a first error to be produced in detecting the level of the first site in each of the different portions;

detecting the level of the first site in each of first particular portions of the different portions to determine a constant term of a first function which represents the shape of the surface of the substrate including said first particular portions;

detecting the level of the second site in each of second particular portions of the different portions to determine a constant term of a second function which represents the shape of the surface of the substrate including the second particular portions;

determining a second error to be produced in detecting the level of the second site in each of the different portions, by suing the first error and a difference between the constant terms of the first and second functions; and detecting the level of each of the first and second sites in each of the different portions while correcting the first and second errors.

29. A method according to claim 28, further comprising the step of determining the second error on the basis of a difference between the first error and the difference in the constant terms of the first and second functions.

30. A method according to claim 28, wherein the substrate is a semiconductor wafer.

31. A method according to claim 28, further comprising the step of detecting the levels of the first and second sites in each portion with the optical sensor by suing plural beams having different wavelengths.

32. A method according to claim 28, wherein, for said determination of the surface position of each portion, said method further comprises the step of processing data representing the levels of the first and second sites in accordance with a least square method.

33. In a position determining method, usable with a first substrate having different portions on which the same patterns are formed and a second substrate having different portions on which patterns the same as those of the first substrate are formed, for determining the surface position of each of the different portions of the first substrate by detecting levels of first and second different sites in that portion by sue of an optical sensor, the improvements residing in the steps of:

determining a first error to be produced in detecting the level of the first site in each of the different portions of the first substrate;

detecting the level of a site in each of first particular portions of the different portions of the second substrate, which site corresponds to the first site in each portion of the first substrate, by using the optical sensor to determine a constant term of a first function which represents the shape of the surface of the second substrate including the first particular portions;

detecting the level of a site in each of second particular portions of the different portions of the second substrate, which site corresponds to the second site in each portion of the first substrate, by using the optical sensor to determine a constant term of a second function which represents the shape of the surface of the second substrate including the second particular portions;

determining a second error to be produced in detecting the level of the second site in each of the different portions of the first substrate, by using the first error and a difference between the constant terms of the first and second functions; and detecting the level of each of the first and second sites in each of the different portions of the first substrate while correcting the first and second errors.

34. A method according to claim 33, further comprising the step of determining the second error on the basis of a difference between the first error and the deference in constant terms of the first and second functions.

35. A method according to claim 33, wherein each of the first and second substrates is a semiconductor wafer.

36. A method according to claim 33, further comprising the step of detecting the levels of the first and second sites in each portion with the optical sensor by suing plural beams having different wavelengths.

37. A method according to claim 33, wherein, for said determination of the surface position of each portion, said method further comprises the step of processing data representing the levels of the first and second sites on the first substrate in accordance with a least square method.

38. In a semiconductor device manufacturing method, usable with a wafer having different portions on which the same patterns are formed, wherein a deviation of the surface in each of the different portions of the wafer from a focal plane of a projection optical system is determined by detecting levels of first and second different sites in that portion by sue of an optical sensor and wherein, after correction of the deviation, an image of a circuit pattern is projected on each portion through the projection optical system for transfer of the pattern to that portion, the improvements residing in the steps of:

determining a first error to be produced in detecting the level of the first site in each of the different portions;

detecting the level of the first site in each of first particular portions of the different portions to determine a constant term of a first function which represents the shape of the surface of the wafer including the first particular portions;

detecting the level of the second site in each of second particular portions of the different portions to determine a constant term of a second function which represents the shape of the surface of the wafer including the second particular portions;

determining a second error to be produced in detecting the level of the second site in each of the different portions, bu using the first error and a difference between the constant terms of the first and second functions; and detecting the level of each of the first and second sites in each of the different portions while correcting the first and second errors.

39. In a semiconductor device manufacturing method, usable with a first wafer having different portions on which the same patterns are formed and a second wafer having different portions on which patterns the same as those of the first wafer are formed, wherein a deviation of the surface in each of the different portions of the first wafer from a focal plane of a projection optical system is detected by detecting levels of first and second different sites in that portion by use of an optical sensor, and wherein, after correction of the deviation, an image of a circuit patter is projected on that portion through the projection optical system for transfer of the pattern to that portion, the improvements residing in the steps of:

determining a first error to be produced in detecting the level of the first site in each of the different portions of the first wafer;

detecting the level of a site in each of first particular portions of the different portions of the second wafer, which site corresponds to the first site in each portion of the first wafer, by using the optical sensor to determine a constant term of a first function which represents the shape of the surface of the second wafer including the first particular portions;

detecting the level of a site in each of second particular portions of the different portions of the second wafer, which site corresponds to the second site in each portion of the first wafer, by using the optical sensor to determine a constant term of a second function which represent the shape of the surface of the wafer including the second particular portions;

determining a second error to be produced in detecting the level of the second site in each of the different portions of the first wafer, by using the first error and a difference between the constant terms of the first and second functions; and detecting the level of each of the first and second sites in each of the different portions of the first wafer while correcting the first and second errors.

40. In a position determining method, usable with a substrate having different portions on which the same patterns are formed, for determining the surface position of each of the different portions by detecting a level of a predetermined site in that portion by sue of an optical sensor, the improvements residing in the steps of:

detecting the level of the predetermined site in each of particular portions of the different portions to determine the shape of the surface of the substrate including the particular portions;

determining, on the basis of the determined surface shape, an error to be produced in detecting the level of the predetermined site in dependence upon the structure of the pattern at the predetermined site; and detecting the level of the predetermined site in each of the different portions while correcting the error.

41. In a position determining method, usable with a first substrate having different portions on which the same patterns are formed and a second substrate having different portions on which patterns the same as those of the first substrate are formed, for determining the surface position of each of he different portions of the first substrate by detecting a level of a predetermined site in that portion by use of an optical sensor, the improvements residing in the steps of:

detecting the level of a site in each of particular portions of the different portions of the second substrate, which site corresponds to the predetermined site in each portion of the first substrate, by using the optical sensor to determine the shape of he surface of the second substrate including the particular portions;

determining, on the basis of the determined surface shape, an error to be produced in detecting the level of the predetermined site in each portion of the first substrate in dependence upon the structure of the pattern at the predetermined site; and detecting the level of the predetermined site in each of the different portions of the first substrate while correcting the error.

42. In a semiconductor device manufacturing method, usable with a wafer having different portions on which the same patterns are formed, wherein a deviation of the surface in each of her different portions of the wafer from a focal plane of a projection optical system is detected by detecting a level of a predetermined site in that portion by sue of an optical sensor, and wherein, after correction of the deviation, an image of a circuit pattern is projected onto that portion for transfer of the pattern to the same, the improvements residing in the steps of:

detecting the level of the predetermined site in each of particular portions of the different portions of the wafer to determine the shape of the surface of the wafer including the particular portions;

determining, on the basis of the determined surface shape, an error to be produced in detecting the level of the predetermine site in dependence upon the structure of the pattern at the predetermined site; and detecting the level of the predetermined site in each of the different portions while correcting the error.

43. In a semiconductor device manufacturing method, usable with a first waver having different portions on which the same patterns are formed and a second wafer having different portions on which patterns the same as those of the first wafer are formed, wherein a deviation of the surface inc each of the different portions of the first wafer from a focal plane of a projection optical system is detected by detecting a level of a predetermined site in that portion by sue of an optical sensor, and wherein, after correction of the deviation, an image of a circuit pattern is projected on that portion for transfer of the pattern to the same, the improvements residing in the steps of:

detecting the level of a site in each of particular portions of the different portions of the second wafer, which site corresponds to the predetermined site in each portion of the first wafer, by using the optical sensor to determine the shape of the surface of the second wafer including the particular portions;

determining, on the basis of the determined surface shape, an error to be produced in detecting the level of the predetermined site in each portion of the first wafer in dependence upon the structure of the pattern at the predetermined suite; and detecting the level of the predetermined site in each of the different portions of the first wafer while correcting the error.

44. A method according to claim 28, wherein the first particular portions are the same as the second particular portions.

45. A method according to claim 33, wherein the first particular portions are the same as the second particular portions.

46. A method according to claim 38, wherein the first particular portions are the same as the second particular portions.

47. A method according to claim 39, wherein the first particular a portions are the same as the second particular portions.

48. A method according to claim 40, wherein the first particular portions are the same as the second particular portions.

49. A method according to claim 41, wherein the first particular portions are the same as the second paricular portions.

50. A method according to claim 42, wherein the first particular portions are the same as the second particular portions.

51. A method according to claim 43, wherein the first particular portions are the same as the second particular portions.

52. A method according to claim 28, wherein the first site is located substantially at the middle of the different portions.

53. A method according to claim 33, wherein the first site is located substantially at the middle of the different portions.

54. A method according to claim 38, wherein the first site is located substantially at the middle of the different portions.

55. A method according to claim 39, wherein the first site is located substantially at the middle of the different portions.

* * * * *

UNITED STATES PATENT AND TRADEMARK OFFICE
CERTIFICATE OF CORRECTION

PATENT NO. : 5,118,957
DATED : June 2, 1992
INVENTOR(S) : Haruna Kawashima, et al.

Page 1 of 3

It is certified that error appears in the above-identified patent and that said Letters Patent is hereby corrected as shown below:

COLUMN 1

Line 28, "to an" should read --to enlarge an--;
Line 43, "there" should be deleted;
Line 49, "4,600,282;." should read --4,600,282.--;
Line 63, "of" should be deleted; and
Line 67, "multiplepoint" should read --multiple-point--.

COLUMN 2

Line 54, "multiplepoint" should read --multiple-point--.

COLUMN 8

Line 37, "f1(x, y) f5(x-f5$\Delta$x,y-$\Delta$y)," should read --f1(x, y) - f5(x + $\Delta$x, y-$\Delta$y),--.

COLUMN 11

Line 55, "chucking to" should read --checking on--.

COLUMN 13

Line 26, "wavelength" should read --wavelengths--.

UNITED STATES PATENT AND TRADEMARK OFFICE
CERTIFICATE OF CORRECTION

PATENT NO. : 5,118,957

DATED : June 2, 1992

INVENTOR(S) : Haruna Kawashima, et al.

It is certified that error appears in the above-identified patent and that said Letters Patent is hereby corrected as shown below:

COLUMN 14

Line 39, "the" should be deleted.

COLUMN 15

Line 18, "at" should read --a--;
Line 20, "step" should read --steps--;
Line 66, "beam" should read --beams--; and
Line 68, "tot eh" should read --to the--.

COLUMN 16

Line 29, "arts" should read --parts--; and "form" should read --from--.

COLUMN 18

Line 63, "suing" should read --using--.

COLUMN 19

Line 40, "deference" should read --difference--;
Line 47, "suing" should read --using--; and
Line 60, "sue" should read --use--.

UNITED STATES PATENT AND TRADEMARK OFFICE
CERTIFICATE OF CORRECTION

PATENT NO. : 5,118,957
DATED : June 2, 1992
INVENTOR(S) : Haruna Kawashima, et al.

It is certified that error appears in the above-identified patent and that said Letters Patent is hereby corrected as shown below:

COLUMN 20

Line 29, "patter" should read --pattern--;
    Line 49, "represent" should read --represents--; and
    Line 64, "sue" should read --use--.

COLUMN 21

Line 15, "he" should read --the--;
    Line 23, "he" should read --the--;
    Line 37, "her" should read --the--;
    Line 40, "sue" should read --use--;
    Line 51, "predetermine" should read --predetermined--; and
    Line 57, "waver" should read --wafer--.

COLUMN 22

Line 1, "inc" should read --in--;
    Line 4, "sue" should read --use--;
    Line 19, "suite;" should read --site;--;
    Line 34, "a" should be deleted.
    Line 40, "paricular" should read --particular--.

Signed and Sealed this

Fourteenth Day of September, 1993

Attest:

BRUCE LEHMAN

Attesting Officer      Commissioner of Patents and Trademarks